United States Patent [19]

Matsui

[11] Patent Number: 5,391,922

[45] Date of Patent: Feb. 21, 1995

[54] SEMICONDUCTOR ELEMENT MODULE

[75] Inventor: Noriyuki Matsui, Kawasaki, Japan

[73] Assignee: Fujitsu Limited, Kawasaki, Japan

[21] Appl. No.: 265,123

[22] Filed: Jun. 24, 1994

[30] Foreign Application Priority Data

Aug. 18, 1993 [JP] Japan .................................. 5-204036

[51] Int. Cl.⁶ ...................... H01L 23/48; H01L 29/44; H01L 29/52

[52] U.S. Cl. ..................................... 257/773; 257/685; 257/693; 257/724; 257/725; 257/784; 361/633; 361/636; 361/726; 361/727; 361/741

[58] Field of Search ................ 361/600, 633, 636, 656, 361/725, 726, 727, 740, 741, 759; 257/685, 686, 693, 723, 724, 725, 773, 784

[56] References Cited

U.S. PATENT DOCUMENTS

| | | | |
|---|---|---|---|
| 4,656,605 | 4/1987 | Clayton | 257/724 |
| 4,862,327 | 8/1989 | Ansell et al. | 361/759 |
| 5,016,138 | 5/1991 | Woodman | 257/686 |
| 5,031,072 | 7/1991 | Malhi et al. | 257/723 |

Primary Examiner—Ngân V. Ngô

Attorney, Agent, or Firm—Staas & Halsey

[57] ABSTRACT

A semiconductor element module is adapted to be mounted on a main body by insertion in a predetermined direction. The semiconductor element module includes a substrate having first and second surfaces, one or a plurality of semiconductor elements mounted on at least one of the first and second surfaces of the substrate, at least a first row of terminals and a second row of terminals provided on at least one of the first and second surfaces of the substrate, where the first row of terminals and the second row of terminals are located at different positions along the predetermined direction, signal lines provided on at least one of the first and second surfaces of the substrate, connecting arbitrary terminals of the semiconductor elements to predetermined ones of the first row of terminals, and a mechanism, coupled to predetermined terminals of at least one of the first row of terminals and the second row of terminals, for adapting signal levels output from the semiconductor element module depending on whether the first row of terminals or the second row of terminals electrically connect to the main body.

8 Claims, 5 Drawing Sheets

SEMICONDUCTOR ELEMENT MODULE

BACKGROUND OF THE INVENTION

The present invention generally relates to semiconductor element modules, and more particularly to a semiconductor element module which is connected to a main body in which a plurality of signal level systems coexist.

Recently, the power supply voltage standard and the signal level which were standardized in semiconductor elements are changing from the 5 V system to the 3.3 V system due to the processes being employed to make the semiconductor elements. There is a possibility that the 3.3 V system may even change to a system of a lower voltage such as 2.5 V and 1.8 V. In addition, even in the low-voltage system such as the 3.3 V system, there are cases where a plurality of interface levels (signal levels) may coexist, and it is necessary to take measures for such cases in a semiconductor element module when employing a system of switching a plurality of signal levels using the same output circuit.

Conventionally, a memory element module which is an example of the semiconductor element module employs a circuit system such as the transistor-transistor logic (TTL) and the emitter-coupled logic (ECL). In addition, while the trend is for the power supply voltage standard and the signal level of the semiconductor element to change to the lower voltage, there are the case where different power supply voltages coexist and the case where a plurality of interface levels coexist in the low voltage system.

In the case where the different power supply voltages coexist, the TTL and ECL may coexist, but a measure such as providing an erroneous insertion preventing mechanism in relation to a printed circuit board and a connector is taken.

On the other hand, in a signal system having a plurality of interface levels, a module of elements which conform to the interface levels is produced for each printed circuit board because there does not exist an element which conforms to a plurality of interface levels.

In the low-voltage system, in addition to the low-voltage-TTL (hereinafter simply referred to as LV-TTL) which uses the low voltage as it is with the threshold levels of the 5 V system, there is for example a proposal to employ the terminated LV-TTL (hereinafter simply referred to as T-LVTTL) which makes the signal transfer with a smaller amplitude and at a higher speed. The threshold level of the 5 V system regards a voltage of 2.0 V or greater as a high level and a voltage of 0.8 V or less as a low level.

According to the T-LVTTL, an intermediate point of LV-TTL push-pull transistors in the 3.3 V system, for example, is coupled to a power supply of 1.5 V via a resistor having a resistance of 50 Ω. The threshold levels are set to 1.5 V±0.2 V, so that it is possible to realize a high-speed transfer with a small amplitude. In other words, the threshold levels are set so that a voltage of 1.7 V of greater is regarded as a high level and a voltage of 1.3 V or less is regarded as a low level.

Therefore, there are cases where a plurality of interface levels exist, such as the case where the LV-TTL and the T-LVTTL coexist. In such cases, if an element which can conform to the plurality of interface levels by switching to different signal level systems is mounted on a module, there is a problem in that it is necessary to modify a signal arrangement of the module or, to set a control signal for the switching every time the switching is made.

SUMMARY OF THE INVENTION

Accordingly, it is a general object of the present invention to provide a novel and useful semiconductor element device in which the problem described above is eliminated.

Another and more specific object of the present invention is to provide a semiconductor element module adapted to be mounted on a main body by insertion in a predetermined direction, comprising a substrate having first and second surfaces, one or a plurality of semiconductor elements mounted on at least one of the first and second surfaces of the substrate, at least a first row of terminals and a second row of terminals provided on at least one of the first and second surfaces of the substrate, where the first row of terminals and the second row of terminals are located at different positions along the predetermined direction, signal lines provided on at least one of the first and second surfaces of the substrate, connecting arbitrary terminals of the semiconductor elements to predetermined ones of the first row of terminals, and means, coupled to predetermined terminals of at least one of the first row of terminals and the second row of terminals, for adapting signal levels output from the semiconductor element module depending on whether the first row of terminals or the second row of terminals electrically connect to the main body. According to the semiconductor element module of the present invention, it is possible to automatically change the signal level or automatically set the control signal to the semiconductor elements depending on whether the first row of terminals or the second row of terminals electrically connects to the main body. It is unnecessary to change the signal arrangement even if a plurality of signal level systems exist, and a suitable signal level can be obtained from the semiconductor element module. In other words, it is possible to maintain compatibility among the interface standards.

Still another object of the present invention is to provide the semiconductor element module described immediately above, wherein the means comprises a series resistance connected between each of the predetermined terminals out of the first row of terminals and a corresponding one of the second row of terminals. According to the semiconductor element module of the present invention, it is possible to change the signal level output from the semiconductor element module to conform to the signal level system employed in the main body, depending on whether the first row of terminals or the second row of terminals electrically connect to the main body.

A further object of the present invention is to provide the semiconductor element module described first above, wherein the means comprises a pull-up resistance coupling a predetermined power supply voltage to the arbitrary terminals of the semiconductor elements and to the predetermined terminals out of the first row of terminals via a pull-up resistance. According to the semiconductor element module of the present invention, it is possible to automatically set the control signal supplied to the semiconductor elements so that the signal level output from the semiconductor element module conforms to the signal level system employed in the main body, depending on whether the first row or terminals or the second row of terminals electrically connect to the main body.

Other objects and further features of the present invention will be apparent from the following detailed description when read in conjunction with the accompanying drawings.

DESCRIPTION OF THE PREFERRED EMBODIMENTS

Figure 1:
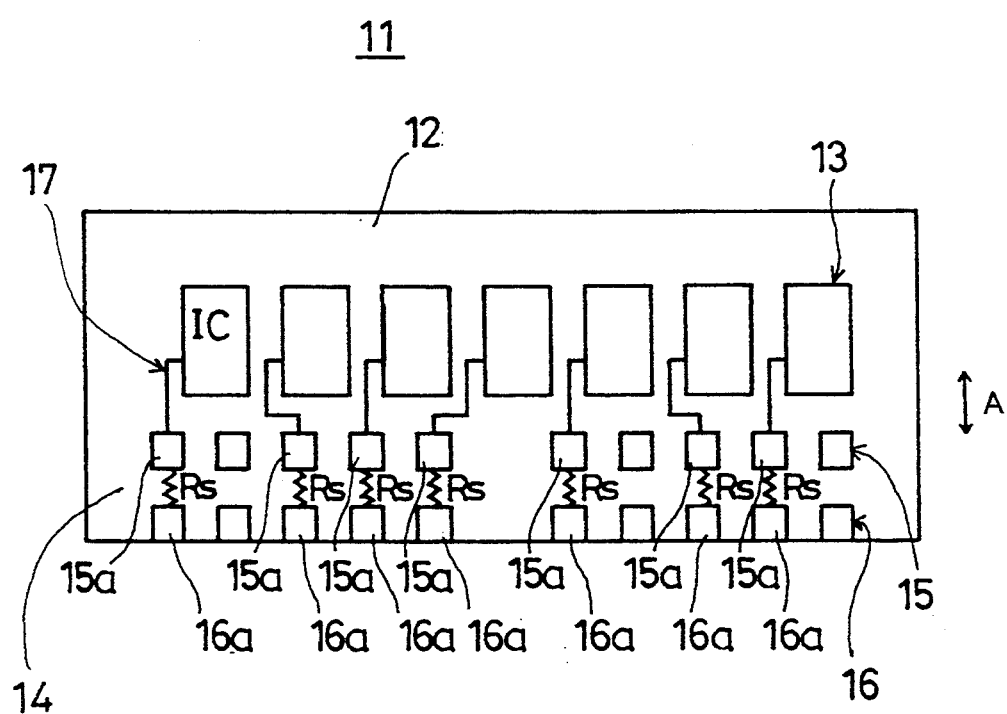
FIG. 1 is a plan view generally showing a first embodiment of a semiconductor element module according to the present invention.
Figure 2A:
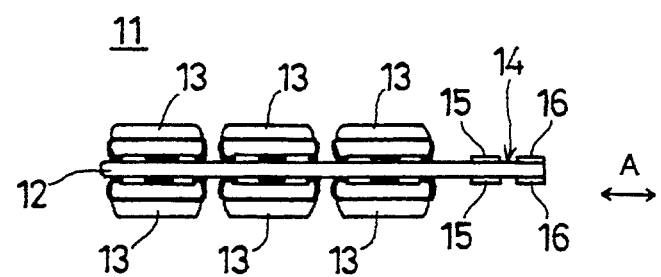
FIGS. 2A and 2B respectively are a side view and a plan view showing the first embodiment in more detail.
Figure 2B:
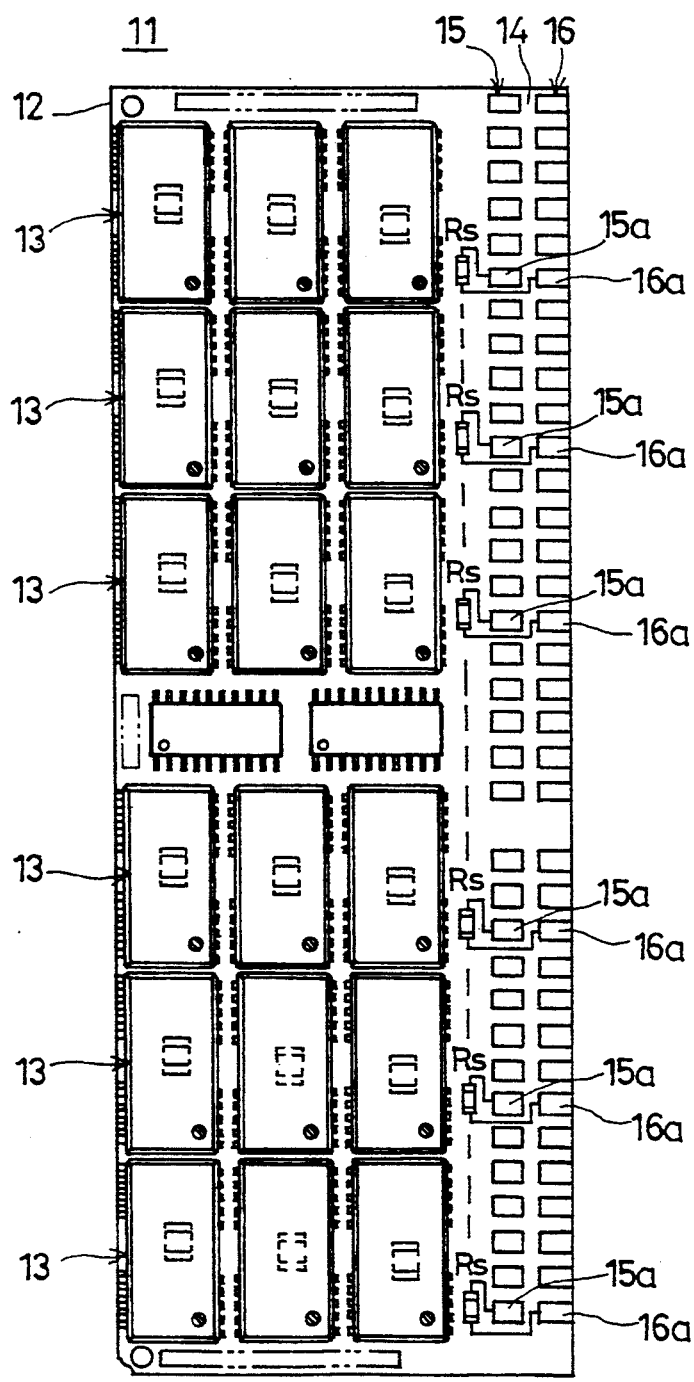

FIG. 1 generally shows a first embodiment of a semiconductor element module according to the present invention. FIGS. 2A and 2B respectively are a side view and a plan view showing the first embodiment in more detail. In this embodiment, the present invention is applied to a memory board.

In FIGS. 1, 2A and 2B, a memory board 11 includes a substrate 12 which is made of an epoxy resin or the like, and predetermined patterns are formed on the substrate 12 by the general plating technique, etching or the like. A predetermined number of surface-mount type memory integrated circuits (ICs, or IC chips) 13 are mounted on both top and bottom surfaces of the substrate 12.

A terminal region 14 is arranged on both the top and bottom surfaces of the substrate 12. Two rows of terminals are formed in each terminal region 14. One of the two rows of terminals is made up of upper terminals 15, and the other of the two rows of terminals is made up of lower terminals 16. The row formed by the upper terminals 15 and the row formed by the lower terminals 16 are provided at different positions along a direction A in which the memory board 11 is inserted and extracted with respect to a mother board (not shown) which will be described later.

Although the illustration thereof is omitted in FIGS. 2A and 2B, signal pins of the memory ICs 13 are connected to a predetermined number of upper signal terminals 15a out of the upper terminals 15 as shown in FIG. 1 via signal lines 17 which are formed on the substrate 12 with the predetermined pattern described above. Of course, a plurality of signal pins from one memory IC 13 may be coupled to a plurality of upper signal terminals 15a if necessary.

A series resistance $R_s$ is connected between each upper signal terminal 15a and a corresponding lower signal terminal 16a out of the lower terminals 16. As will be described later in conjunction with FIGS. 3A through 3C and FIGS. 4A through 4C, each lower signal terminal 16a is connected to a terminating voltage power supply $V_{tt}$ via a terminating resistance $R_t$.

When inserting the memory board 11 into a connector (not shown) of a main body (not shown), the depth of the insertion is set by a stopper (not shown) of the connector so that contact parts of the connector are selectively connected to the upper terminals 15 or the lower terminals 16. In other words, the upper terminals 15 connect to the contact parts of the connector when the memory board 11 is inserted deeply into the connector, and the lower terminals 16 connect to the contact parts of the connector when the memory board 11 is inserted shallowly into the connector.

Figure 3A:
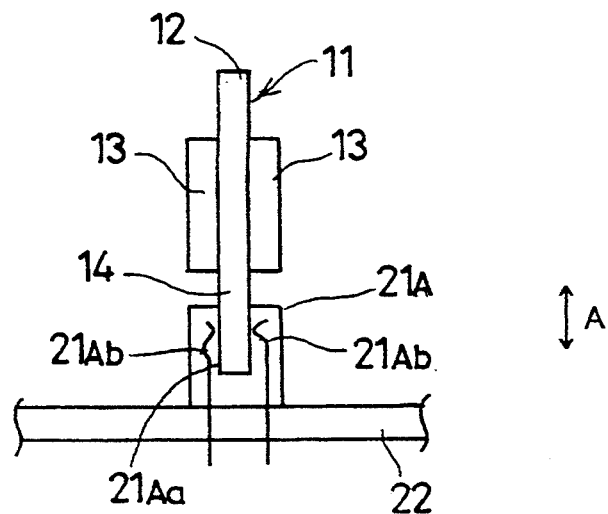
FIGS. 3A, 3B and 3C respectively are diagrams for explaining the insertion of the first embodiment with respect to a mother board to a first position.
Figure 3B:
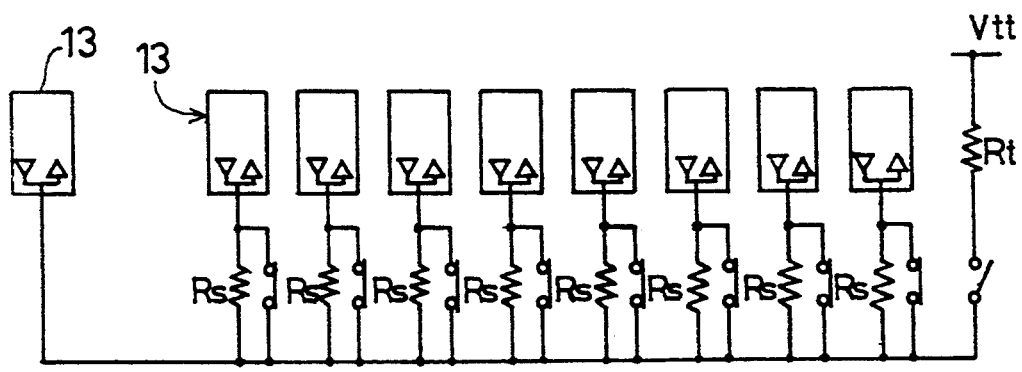
Figure 3C:
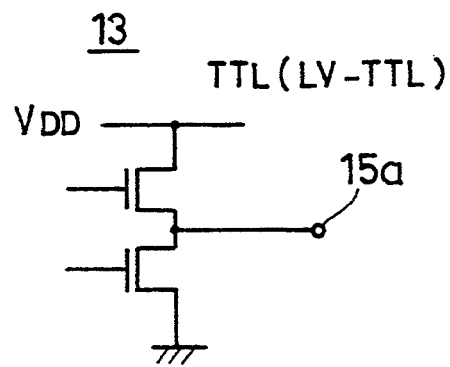
Figure 4A:
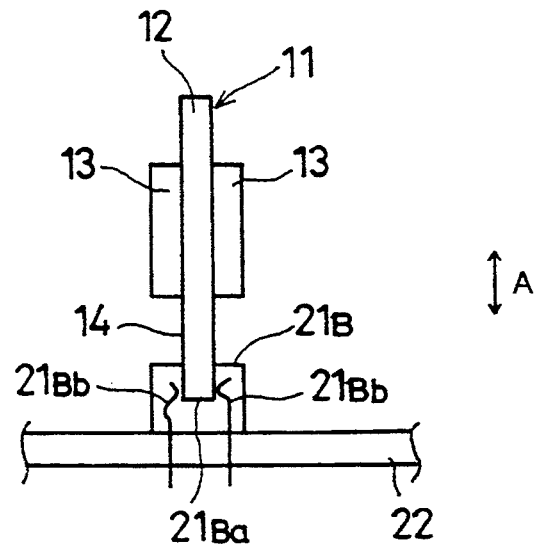
FIGS. 4A, 4B and 4C respectively are diagrams for explaining the insertion of the first embodiment with respect to the mother board to a second position.
Figure 4B:
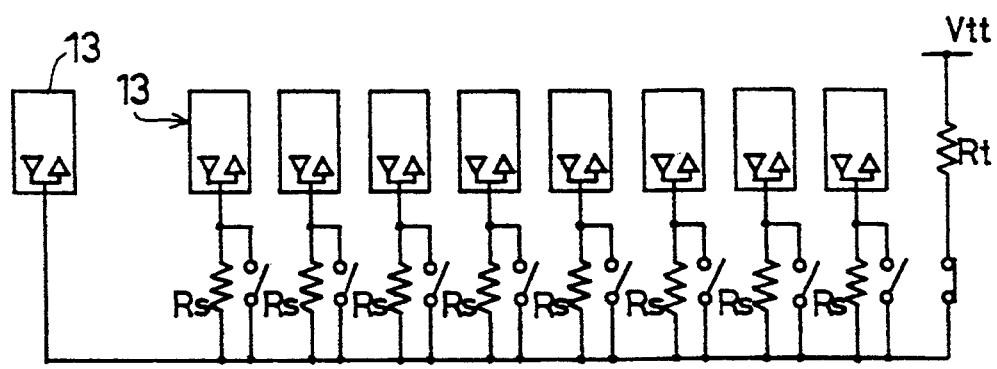
Figure 4C:
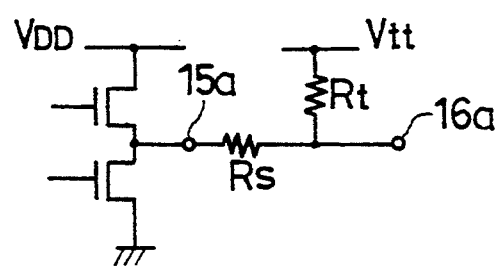

Next, a description will be given of the insertion of first embodiment of the module into a main body, by referring to FIGS. 3A through 3C and FIGS. 4A through 4C. More particularly, a description will be given of the mounting of the memory board 11 shown in FIGS. 1, 2A and 2B with respect to a mother board 22. FIGS. 3A through 3C are diagrams for explaining the mounting of the memory board 11 at a first position of the mother board 22, and FIGS. 4A through 4C are diagrams for explaining the mounting of the memory board 11 at a second position of the mother board 22.

In FIG. 3A, a connector $21_A$ with respect to the memory board 11 is fixed on the mother board 22. This connector $21_A$ has a groove $21_{Aa}$ for receiving the memory board 11 which is inserted to the first position, that is, a deep position, with respect to the mother board 22. In addition, contact parts $21_{Ab}$ are provided on the connector $21_A$ to confront each other within the groove $21_{Aa}$. These contact parts $21_{Ab}$ are provided depending on the number of terminals in the corresponding row of terminals provided on the memory board 11.

For example, the memory board 11 shown in FIG. 3A employs the TTL or the LV-TTL circuit system. Hence, when the terminal region 14 of the memory board 11 is inserted to the bottom of the groove $21_{Aa}$ of the connector $21_A$, the contact parts $21_{Ab}$ of the connector $21_A$ connect to the upper terminals 15 of the memory board 11.

In this case, output signal paths of the memory ICs 13 become equivalent to a circuit diagram shown in FIG. 3B. In other words, in an output system of one memory IC 13, the output signal from the output pin of the memory IC 13 is directly output from the upper signal terminal 15a to the contact part $21_{Ab}$ of the connector $21_A$ as shown in FIG. 3C, and the signal is output from the memory IC 13 not via the series resistance $R_s$. In this case, the terminating resistance $R_t$ connected to the lower terminal 16 is in the released state.

Accordingly, when the memory board 11 employs the TTL circuit system with a power supply voltage $V_{DD}$ of 5 V or the LV-TTL circuit system with a power supply voltage $V_{DD}$ of 3.3 V, signals from the mother board 22 (that is, the main body) are input as they are to the memory board 11. For example, the signal level (interface level) is determined by a threshold level of 2.0 V for the high level and a threshold level of 0.8 V for the low level.

On the other hand, in FIG. 4A, the memory board 11 employs the center tapped termination (CTT) circuit system or the T-LVTTL circuit system. For the sake of convenience, it will be assumed that the circuit board 11 employs the T-LVTTL circuit system using threshold voltages 1.5±0.2 V, that is, the threshold voltage of 1.7 V for the high level and the threshold voltage of 1.3 V for the low level. Accordingly, the power supply voltage $V_{DD}$ is set to 3.3 V, the terminating voltage power supply $V_{tt}$ is set to 1.5 V, the terminating resistance $R_t$ is set to 20 Ω, and the series resistance $R_s$ is set to 20 Ω, for example.

On the other hand, a connector $21_B$ with respect to the memory board 11 is fixed on the mother board 22 shown in FIG. 4A. This connector $21_B$ conforms to the T-LVTTL circuit system, and has a groove $21_{Ba}$ for receiving the memory board 11 which is inserted to the second position, that is, a shallow position, with respect to the mother board 22. In addition, contact parts $21_{Bb}$ are provided on the connector $21_B$ to confront each other within the groove $21_{Ba}$. These contact parts $21_{Bb}$ are provided depending on the number of terminals in the corresponding row of terminals provided on the memory board 11.

In this case, the memory board 11 shown in FIG. 4A employs the T-LVTTL circuit system as described above. Hence, when the terminal region 14 of the memory board 11 is inserted to the bottom of the groove $21_{Ba}$ of the connector $21_B$, the contact parts $21_{Bb}$ of the connector $21_B$ connect to the lower terminals 16 of the memory board 11.

In this case, output signal paths of the memory ICs 13 become equivalent to a circuit diagram shown in FIG. 4B. The series resistance $R_s$ is interposed between the output pin of each memory IC 13 and the corresponding lower signal terminal 16a, and the terminating voltage $V_{tt}$ is applied to the lower signal terminals 16 via the terminating resistances $R_t$.

In other words, in an output system of one memory IC 13, the output signal from the output pin of the memory IC 13, that is, the output signal from the upper signal terminal 15a, is output from the lower signal terminal 16a with a small amplitude at a high speed to the contact part $21_{Bb}$ of the connector $21_B$ as shown in FIG. 4C, due to the provision of the series resistance $R_s$ and the terminating resistance $R_t$. As a result, it is possible to transfer signals from the memory board 11 with a small amplitude at a high speed.

Therefore, it may be seen from FIGS. 3A through 3C and. FIGS. 4A through 4C that the circuit system of the memory board 11 can be switched to either the LV-TTL or the T-LVTTL having different signal levels (interface levels), depending on the on the depth of the insertion of the memory board 11 with respect to the mother board 22, without the need to modify the signal arrangement. That is, the circuit system of the memory boards 11 having the same memory elements can be switched depending on whether the memory board 11 is inserted into the connector $21_A$ or $21_B$ of the mother board 22, and it is thus possible to obtain the signal levels (interface levels) suited for the interface used.

Next, a description will be given of a second embodiment of the semiconductor element module according to the present invention, by referring to FIGS. 5, 6A and 6B. In this embodiment, the present invention is also applied to a memory board.

Figure 5:
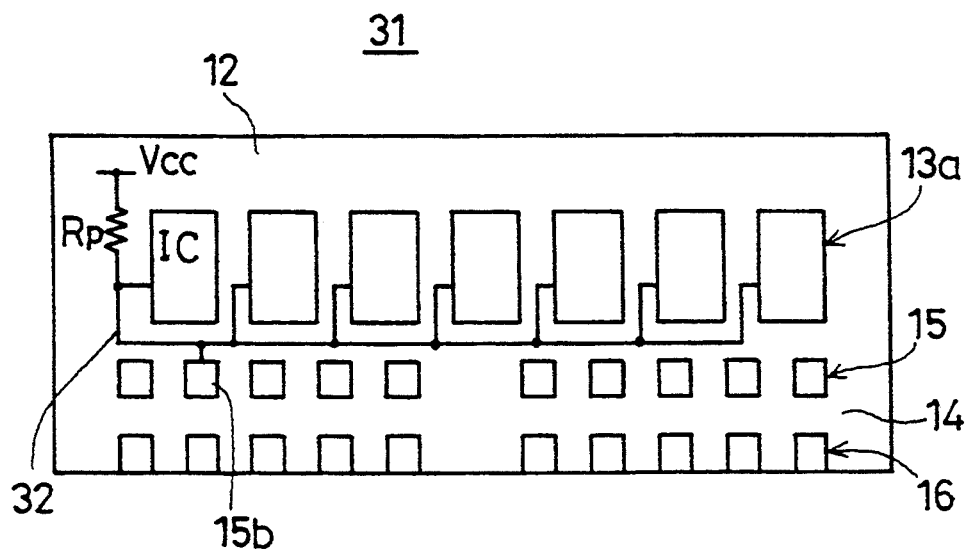
FIG. 5 is a plan view generally showing a second embodiment of the semiconductor element module according to the present invention.

FIG. 5 generally shows the second embodiment of the semiconductor element module, and in FIG. 5, those parts which are the same as those corresponding parts in FIG. 1 are designated by the same reference numerals, and a description thereof will be omitted.

In FIG. 5, a memory board 13 includes a substrate 12, and a predetermined number of memory ICs 13a are mounted on this substrate 12. An operation mode of the memory ICs 13a can be switched in response to a control signal. Similarly to the first embodiment shown in FIG. 1, two rows of terminals, namely, the upper terminals 15 and the lower terminals 16, are formed in each terminal region 14.

A control pin of each memory IC 13a is connected to a corresponding control terminal 15b out of the upper terminals 15 via a control line 32 which has a predetermined pattern on the substrate 12. In addition, a voltage $V_{cc}$ from a power supply ($V_{cc}$) is applied to each control terminal 15b via a pull-up resistance $R_p$.

In this embodiment, the memory board 31 operates in the LV-TTL circuit system when a low-level control signal is input to each control pin of the memory ICs 13a, and operates in the T-LVTTL circuit system when a high-level control signal is input to each control pin of the memory ICs 13a. Accordingly, contact parts $21_{Ab1}$ and $21_{Bb1}$ corresponding to the control terminals 15b of the memory board 31, out of the contact parts $21_{Ab}$ and $21_{Bb}$ of the connectors $21_A$ and $21_B$ shown in FIGS. 6A and 6B, are connected to the ground GND on the mother board 22.

Figure 6A:
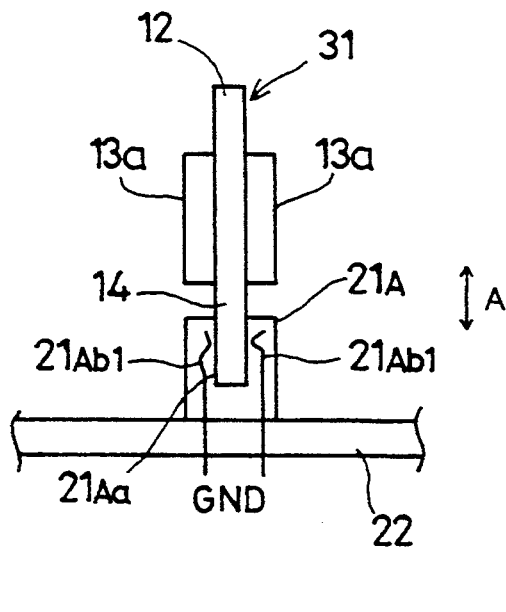
FIGS. 6A and 6B respectively are diagrams for explaining the insertion of the second embodiment with respect to a mother board at first and second positions.

When the memory board 31 is inserted deeply into the connector $21_A$ of the mother board 22 as shown in FIG. 6A, the grounded contact parts $21_{Ab1}$ of the connector $21_A$ connect to the control terminals 15b out of the upper terminals 15. Hence, a low-level control signal is input to the control pin of each memory IC 13a, and each memory IC 13a of the memory board 31 operates in the LV-TTL mode.

Figure 6B:
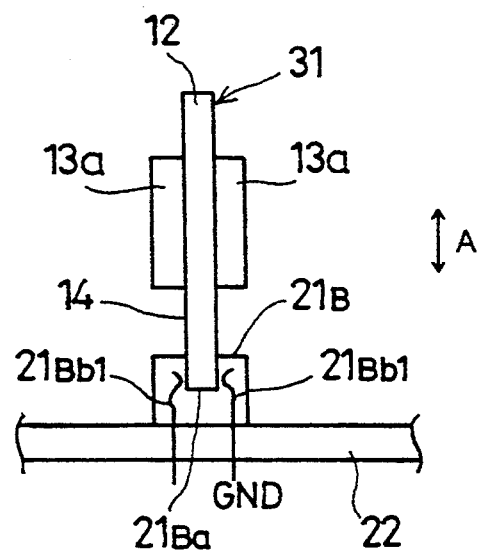

On the other hand, when the memory board 31 is inserted shallowly into the connector $21_B$ of the mother board 22 as shown in FIG. 6B, the contact parts $21_{Bb1}$ of the connector $21_B$ connect to the lower terminals 16, and the control terminals 15b out of the upper terminals 15 are not connected to the contact parts $21_{Bb1}$ of the connector $21_B$ and thereby assume floating states. As a result, a high-level control signal is input to the control pin of each memory IC 13a due to the pull-up resistance $R_p$, and each memory IC 13a of the memory board 31 operates in the T-LVTTL mode.

In this embodiment, if the memory IC 13a is of the type which can switch the driving capacity or capability of the output circuit in response to a control signal, it is possible to automatically set the switching of the control signal or the control signal level depending on the depth of the insertion of the memory board 31 with respect to the connector $21_A$ or $21_B$ of the mother board 22. In other words, it is possible to obtain an appropriate signal level for the selected circuit system, without having to modify the signal arrangement.

Of course, the number of rows of terminals provided on the substrate is not limited to two, and three or more rows of terminals may be provided. In addition, the ICs and/or the terminals may only be provided on one surface of the substrate.

Moreover, in the described embodiments, the memory board is inserted (or mounted) with respect to a mother board, but the insertion (or mounting) may be made with respect to an arbitrary main body other than the mother board. In addition, the semiconductor element module is of course not limited to the memory board.

Further, the present invention is not limited to these embodiments, but various variations and modifications may be made without departing from the scope of the present invention.

What is claimed is:

1. A semiconductor element module adapted to be mounted on a main body by insertion in a predetermined direction, said semiconductor element module comprising:

a substrate having first and second surfaces;

one or a plurality of semiconductor elements mounted on at least one of the first and second surfaces of said substrate;

at least a first row of terminals and a second row of terminals provided on at least one of the first and second surfaces of said substrate, said first row of terminals and said second row of terminals being located at different positions along said predetermined direction;

signal lines provided on at least one of the first and second surfaces of said substrate, connecting arbitrary terminals of said semiconductor elements to predetermined ones of said first row of terminals; and means, coupled to predetermined terminals of at least one of said first row of terminals and said second row of terminals, for adapting signal levels output from said semiconductor element module depending on whether said first row of terminals or said second row of terminals electrically connect to the main body.

2. The semiconductor element module as claimed in claim 1, wherein said means comprises a series resistance connected between each of said predetermined terminals out of said first row of terminals and a corresponding one of said second row of terminals.

3. The semiconductor element module as claimed in claim 2, wherein different signal levels coexist in the main body, and said series resistance varies a signal level when said semiconductor element module is mounted on the main body and said second row of terminals electrically connect to the main body.

4. The semiconductor element module as claimed in claim 3, wherein said second row of terminals each receive a predetermined power supply voltage via a terminating resistor when said semiconductor element module is mounted on the main body and said second row of terminals electrically connect to the main body.

5. The semiconductor element module as claimed in claim 1, wherein the main body comprises a mother board, and said semiconductor element module takes a form of a circuit board.

6. The semiconductor element module as claimed in claim 5, wherein said semiconductor elements comprise semiconductor integrated circuits.

7. The semiconductor element module as claimed in claim 1, wherein said means comprises a pull-up resistance coupling a predetermined power supply voltage to the arbitrary terminals of said semiconductor elements and to said predetermined terminals out of said first row of terminals via a pull-up resistance.

8. The semiconductor element module as claimed in claim 7, wherein said arbitrary terminals of said semiconductor elements receive a control signal, and a supply of the control signal to said arbitrary terminals of said semiconductor elements is controlled depending on whether said first row of terminals or said second row of terminals electrically connect to the main body.

* * * * *